(12) United States Patent
Cohen et al.

(10) Patent No.: US 7,053,002 B2
(45) Date of Patent: May 30, 2006

(54) PLASMA PRECLEAN WITH ARGON, HELIUM, AND HYDROGEN GASES

(75) Inventors: Barney M. Cohen, Santa Clara, CA (US); Kenny King-Tai Ngan, Fremont, CA (US); Xiangbing Li, San Jose, CA (US)

(73) Assignee: Applied Materials, INC, Santa Clara, CA (US)

(*) Notice: Subject to any disclaimer, the term of this patent is extended or adjusted under 35 U.S.C. 154(b) by 267 days.

(21) Appl. No.: 09/206,027

(22) Filed: Dec. 4, 1998

(65) Prior Publication Data

US 2002/0009892 A1 Jan. 24, 2002

(51) Int. Cl.
 *H01L 21/302* (2006.01)

(52) U.S. Cl. .................. 438/714; 438/706; 438/710; 134/1.1; 134/1.2

(58) Field of Classification Search ............. 438/706, 438/715, 710, 723, 734, 712, 714, 725; 252/79.1; 134/1.1, 1.2; 216/58, 72, 67, 58.67
See application file for complete search history.

(56) References Cited

U.S. PATENT DOCUMENTS

| | | | | |
|---|---|---|---|---|
| 4,028,155 A | 6/1977 | Jacob | ......................... | 156/643 |
| 4,711,698 A | 12/1987 | Douglas | ..................... | 156/643 |
| 4,872,947 A | 10/1989 | Wang et al. | ................. | 156/643 |
| 5,000,819 A | 3/1991 | Pedder et al. | ................ | 156/643 |
| 5,232,871 A | 8/1993 | Ho | .............................. | 437/190 |
| 5,248,636 A * | 9/1993 | Davis et al. | ................. | 438/709 |
| 5,266,154 A * | 11/1993 | Tatsumi | ........................ | 156/643 |
| 5,423,941 A * | 6/1995 | Komura et al. | ........... | 156/643.1 |
| 5,476,182 A | 12/1995 | Ishizuka et al. | .............. | 216/68 |
| 5,527,718 A * | 6/1996 | Seita et al. | .................. | 438/471 |
| 5,534,445 A * | 7/1996 | Tran et al. | .................... | 438/162 |
| 5,572,072 A | 11/1996 | Lee | .............................. | 257/751 |
| 5,607,542 A | 3/1997 | Wu et al. | ................. | 156/643.1 |
| 5,643,834 A | 7/1997 | Harada et al. | .............. | 437/210 |
| 5,660,682 A | 8/1997 | Zhao et al. | .................. | 438/715 |
| 5,674,373 A | 10/1997 | Negrerie et al. | ............ | 205/160 |
| 5,725,938 A | 3/1998 | Jin et al. | ..................... | 428/210 |
| 5,726,097 A * | 3/1998 | Yanagida | ..................... | 438/622 |
| 5,773,367 A * | 6/1998 | Jen | .............................. | 438/734 |
| 5,843,847 A | 12/1998 | Pu et al. | ..................... | 438/723 |
| 5,872,058 A * | 2/1999 | Van Cleemput et al. | .... | 438/692 |

(Continued)

FOREIGN PATENT DOCUMENTS

EP 0 430 303 A2 12/1990

(Continued)

OTHER PUBLICATIONS

Yasushi Sawada, Hiroshi Tamaru, Masuhiro Kogoma, Motoaki Kawase, and Kenji Hashimoto, "The Reduction of Copper Oxide Thin Films With Hydrogen Plasma Generated By An Atmospheric-Pressure Glow Discharge," J. Phys. D: Appl. Phys. 29 (1996), pp. 2539-2544.

(Continued)

*Primary Examiner*—Lan Vinh
(74) *Attorney, Agent, or Firm*—Keith M. Tackett

(57) ABSTRACT

The present invention provides a method and apparatus for precleaning a patterned substrate with a plasma comprising a mixture of argon, helium, and hydrogen. Addition of helium to the gas mixture of argon and hydrogen surprisingly increases the etch rate in comparison to argon/hydrogen mixtures. Etch rates are improved for argon concentrations below about 75% by volume. RF power is capacitively and inductively coupled to the plasma to enhance control of the etch properties. Argon, helium, and hydrogen can be provided as separate gases or as mixtures.

20 Claims, 5 Drawing Sheets

Etch rates and uniformites for mixtures of argon and helium-hydrogen.

U.S. PATENT DOCUMENTS

| | | | |
|---|---|---|---|
| 5,877,032 A * | 3/1999 | Guinn et al. | 438/9 |
| 5,877,087 A | 3/1999 | Mosely et al. | 438/656 |
| 5,899,720 A | 5/1999 | Mikagi | 438/303 |
| 5,935,874 A * | 8/1999 | Kennard | 438/710 |
| 5,950,083 A | 9/1999 | Inoue et al. | 438/233 |
| 5,970,378 A | 10/1999 | Shue et al. | 438/656 |
| 6,033,537 A | 3/2000 | Suguro | 204/192.2 |
| 6,395,150 B1 * | 5/2002 | Van Cleemput et al. | 204/192.37 |

FOREIGN PATENT DOCUMENTS

| | | |
|---|---|---|
| EP | 0 520 519 A1 | 12/1992 |
| EP | 0 553 961 A2 | 1/1993 |
| EP | 0 849 779 A2 | 12/1997 |
| FR | 0849779 A2 * | 6/1998 |
| GB | 2 290 166 A | 12/1995 |
| GB | 2 283 461 A | 5/1998 |
| GB | 2 319 532 A | 5/1998 |
| GB | 2 319 533 A | 5/1998 |
| JP | 06097111 | 8/1994 |

OTHER PUBLICATIONS

PCT International Search Report for PCT/US99/27829.

* cited by examiner

PLASMA PRECLEAN WITH ARGON, HELIUM, AND HYDROGEN GASES

FIELD OF THE INVENTION

The present invention relates to an apparatus and method for forming integrated plug and wire interconnects on a substrate having submicron features. More particularly, the present invention relates to a sequence for forming metal interconnects wherein a patterned dielectric layer is exposed to a plasma containing an inert gas and a reactive gas.

BACKGROUND OF THE INVENTION

Sub-half micron multilevel metallization is one of the key technologies for the next generation of very large scale integration ("VLSI"). The multilevel interconnects that lie at the heart of this technology require planarization of high aspect ratio features such as plugs and other interconnects. Reliable formation of these interconnects is very important to the success of VLSI and to the continued effort to increase circuit density and quality on individual substrates and die.

Conventional chemical vapor deposition (CVD) and physical vapor deposition (PVD) techniques are used to deposit electrically conductive material into the contact holes, vias, trenches, or other patterns formed on the substrate. One problem with conventional processes arises because the contact holes or other patterns often comprise high aspect ratios, i.e., the ratio of the height of the holes to their width or diameter is greater than 1. The aspect ratio of the holes increases as advances in technology yield more closely spaced features.

The presence of native oxides and other contaminants within a small feature typically results in voids by promoting uneven distribution of the depositing metal. The native oxide typically forms as a result of exposing the exposed film layer/substrate to oxygen. Oxygen exposure occurs when moving substrates between processing chambers at atmospheric conditions, or when the small amount of oxygen remaining in a vacuum chamber contacts the wafer/film layer, or when a layer is contaminated by etching. Other contaminants within the features can be sputtered material from an oxide over-etch, residual photoresist from a stripping process, leftover hydrocarbon or fluorinated hydrocarbon polymers from a previous oxide etch step, or redeposited material from a preclean sputter etch process. The native oxide and other contaminants create regions on the substrate which interfere with film formation, by creating regions where film growth is stunted. Regions of increased growth merge and seal the small features before regions of limited growth can be filled with the depositing metal.

The presence of native oxides and other contaminants also can increase the via/contact resistance and can reduce the electromigration resistance of small features. The contaminants can diffuse into the dielectric layer, the sublayer, or the deposited metal and alter the performance of devices which include the small features. Although contamination may be limited to a thin boundary region within the features, the thin boundary region is a substantial part of the small features. The acceptable level of contaminants in the features decreases as the features get smaller in width.

Precleaning of features using sputter etch processes is effective for reducing contaminants in large features or in small features having aspect ratios smaller than about 4:1. However, sputter etch processes can damage silicon layers by physical bombardment, sputter deposit Si/$SiO_2$ onto sidewalls of the features, and sputter metal sublayers, such as aluminum or copper, onto sidewalls of the features. For larger features, the sputter etch processes typically reduce the amount of contaminants within the features to acceptable levels. For small features having larger aspect ratios, sputter etch processes have not been as effective in removing contaminants within the features, thereby compromising the performance of the devices which are formed.

Preclean by sputter etch processes is particularly unsuitable for features with copper formed or exposed nearby. Copper easily diffuses through dielectrics, including sidewalls of vias formed in dielectrics, destroying or compromising the integrity of the dielectric. This diffusion is especially true for TEOS, thermal oxide and some low K dielectric materials. Therefore, a new preclean process without any bias on the substrate is needed for a Cu preclean application.

Referring to FIG. 1, a substrate 10 including a hole 11 formed within an electrically insulative or dielectric layer 12 thereon, such as for example, a silicon dioxide or silicon nitride layer is shown. It is difficult to deposit a uniform metal-containing layer into the high aspect ratio hole 11 because contaminants on the sidewalls 14 of the holes promote uneven deposition of the metal containing layer. The metal containing layer eventually converge across the width of the hole before it is completely filled, thus forming voids and discontinuities within the metal-containing material. Thereafter, the high mobility of metal atoms surrounding the voids causes the atoms to diffuse and minimize the surface area of the voids forming circular shaped voids as shown in FIG. 1. These voids and discontinuities result in poor and unreliable electrical contacts.

Precleaning is preferably conducted with a mixture of an inert gas, typically argon, and a reactive gas, typically hydrogen. Mixtures of argon and hydrogen remove both reactive and non-reactive contaminants and can be used to modify the shape of contact holes, vias, trenches and other patterns to improve subsequent metal deposition processes. Increasing the argon content in the preclean mixture provides a corresponding increase in the etch rate of the preclean process and a corresponding decrease in the etch uniformity of the preclean process. Hydrogen must be included in the mixture to effectively remove reactive compounds or contaminants such as copper oxides and hydrocarbons. Precleaning patterned substrates with a mixture of argon and any amount of hydrogen provides a lower etch rate and an increased etch non-uniformity than precleaning with argon.

A preclean process having both high concentrations of reactive gases and improved etch rates would substantially promote removal of contaminants by addition of the reactive gases.

SUMMARY OF THE INVENTION

The present invention provides a method and apparatus for precleaning a patterned dielectric layer to remove native oxides and polymers of hydrocarbons and fluorinated hydrocarbons from small feature sizes (such as quarter micron widths and smaller) and which may have high aspect ratios. Generally, the present invention provides a method and apparatus for providing a plasma comprising a mixture of argon, helium, and hydrogen to preclean a patterned substrate. Addition of helium to the gas mixture of argon and hydrogen surprisingly increases the etch rate in comparison to argon/hydrogen mixtures. Etch rates are improved for argon concentrations below about 75% by volume. The etch rate actually increases as the argon volume % drops from about 75% to about 25%, and then the etch rate declines as the argon volume % is further reduced.

Control of the etch rate is provided by controlling the mixture of argon, helium, and hydrogen, and by controlling the chamber pressure. Furthermore, RF power is capacitively and inductively coupled to the plasma to enhance control of the etch properties. Argon, helium, and hydrogen can be provided as separate gases or as mixtures, however, mixing of helium with 5% by volume of hydrogen is preferred for safety and etch performance.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefor not to be considered limiting of its scope, for the invention may admit to other equally effective embodiments.

DETAILED DESCRIPTION OF THE INVENTION

Figure 1:
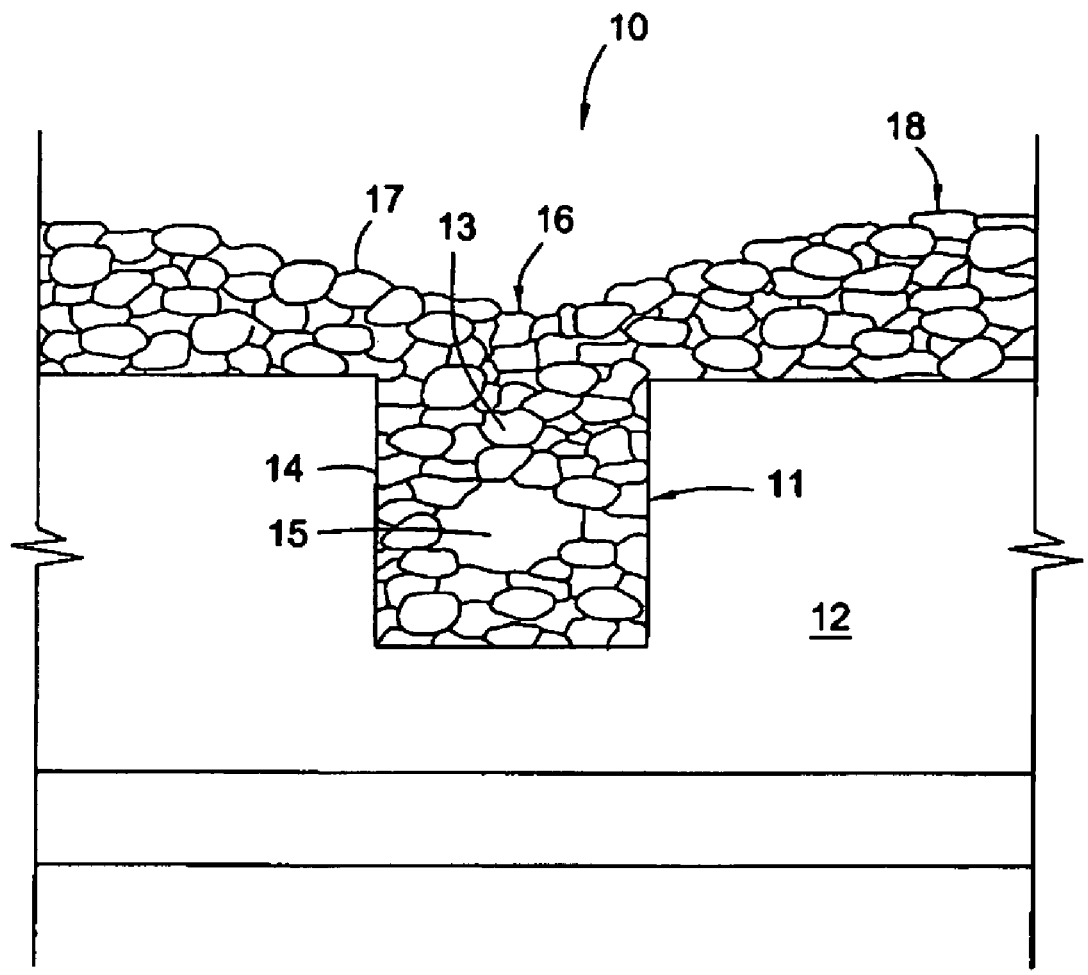
FIG. 1 is a schematic partial sectional view of a patterned substrate showing a randomly-oriented, fine-grained, granular deposition layer in a contact hole in the substrate with voids, discontinuities and a non-planar surface.

The present invention provides an apparatus and method for precleaning a patterned substrate having small feature sizes, such as quarter micron widths that typically have high aspect ratios, i.e., a depth that exceeds the width of the opening. Generally, the present invention provides a process for exposing the patterned substrate to a plasma comprising argon, helium, and hydrogen wherein the gas mixture is controlled to enhance physical or reactive cleaning as desired. Etching of silicon oxide or silicon nitride layers is surprisingly enhanced by adding helium to mixtures of argon and hydrogen, especially when the argon content is less than 75% by volume.

The invention provides a suitable method for precleaning vias, contacts, and other features etched into a dielectric layer, such as a silicon dioxide layer that is etched in a dry or wet etch chamber, to expose a conductive or semi-conductive sublayer, such as Ge, Si, Al, Cu, or TiN sublayers. The feature exposes the sublayer so that the feature can be filled with a conductive or semi-conductive material which connects the sublayer and a subsequent metal interconnect layer to be deposited on the dielectric layer. Etching of the features in the dielectric typically leaves contaminants which should be removed to improve filling of the features and ultimately improve the integrity and reliability of the devices formed.

After etching of the dielectric layer, the features can have damaged silicon or metal residues within the features from over-etching of the dielectric layer. The features can also contain residual photoresist on the feature surfaces from the photoresist stripping and/or ashing process or residual hydrocarbon or fluorinated hydrocarbon polymers from the dielectric etch step. The features may also contain redeposited material on the feature surfaces following a sputter etch preclean process. These contaminants can migrate into the dielectric layer or can interfere with the selectivity of metallization by promoting uneven distribution of the depositing metal. The presence of the contaminants also can increase the resistance of the deposited metal by substantially narrowing the width of the feature, and thus creating a narrowed portion in the metal forming the via, contact line, or other conductive feature.

The submicron features that are cleaned and filled in accordance with the present invention, are formed by conventional techniques which deposit a dielectric material over a surface on a semiconductor substrate. Any dielectric material, whether presently known or yet to be discovered, may be used and is within the scope of the present invention, including low dielectric materials such as organic polymers and aerogels. The dielectric layer may comprise one or more distinct layers and may be deposited on any suitable deposition enhancing sublayer. The preferred deposition enhancing sublayers include conductive metals such as Al and Cu, and barrier surfaces such as TiN, Ta, and TaN.

Once deposited, the dielectric layer is etched by conventional techniques to form vias, contacts, trenches or other submicron features. The features will typically have a high aspect ratio with steep sidewalls. Etching of the dielectric layer may be accomplished with any dielectric etching process, including plasma etching. Specific techniques for etching silicon dioxide include such compounds as carbon tetrafluoride and silicon hexafluoride. However, patterning may be accomplished on any layer using any method known in the art.

A Preferred Precleaning Apparatus

Figure 2:
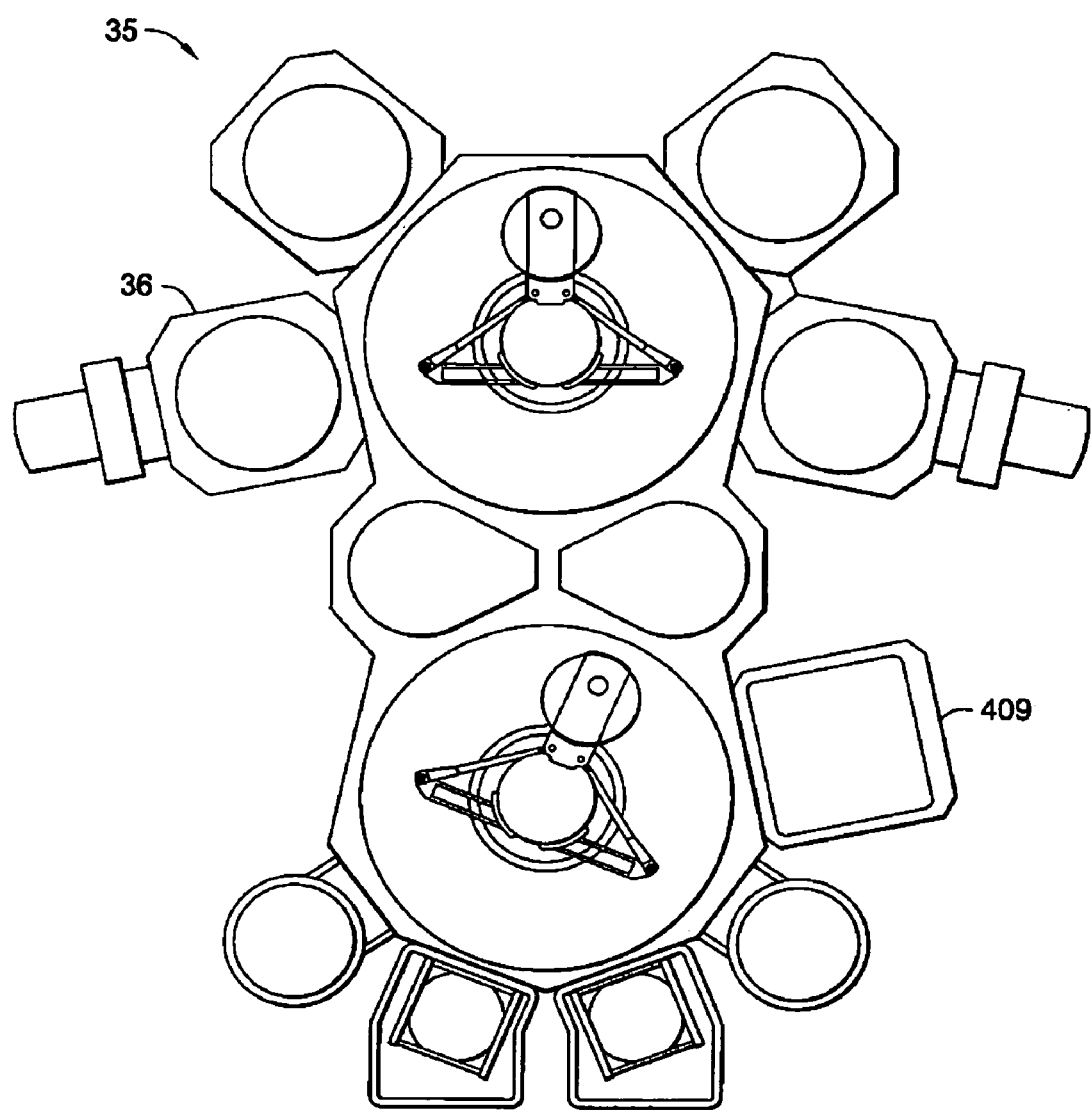
FIG. 2 shows the overall layout of an substrate processing platform having a reaction chamber which generates a plasma to conduct a process of the present invention.

A schematic of a multichamber processing apparatus 35 suitable for performing the CVD, PVD, and plasma treatment process steps of the present invention is illustrated in FIG. 2. The apparatus is an "ENDURA" system commercially available from Applied Materials, Inc., Santa Clara, Calif. The particular embodiment of the apparatus 35 shown herein is suitable for processing planar substrates, such as semiconductor substrates, and is provided to illustrate the invention, and should not be used to limit the scope of the invention. The apparatus 35 typically comprises a cluster of interconnected process chambers, for example, preclean chambers, CVD and PVD deposition chambers, and rapid thermal annealing chambers.

The apparatus 35 preferably includes at least one enclosed PVD or CVD deposition chamber 36. The apparatus also comprises a preclean chamber 40 (shown in FIG. 3). The precleaning process of the present invention is preferably conducted on a PreClean II chamber which is available from Applied Materials, Inc., Santa Clara, Calif. In a preclean chamber, reactive H radicals are formed and are introduced into the neighborhood of the substrate as primarily neutral species, i.e., not having an electric charge and therefore not an ion, thereby preventing generation of self bias and bombardment of the wafer surface by ions.

Preclean Chamber

Figure 3:
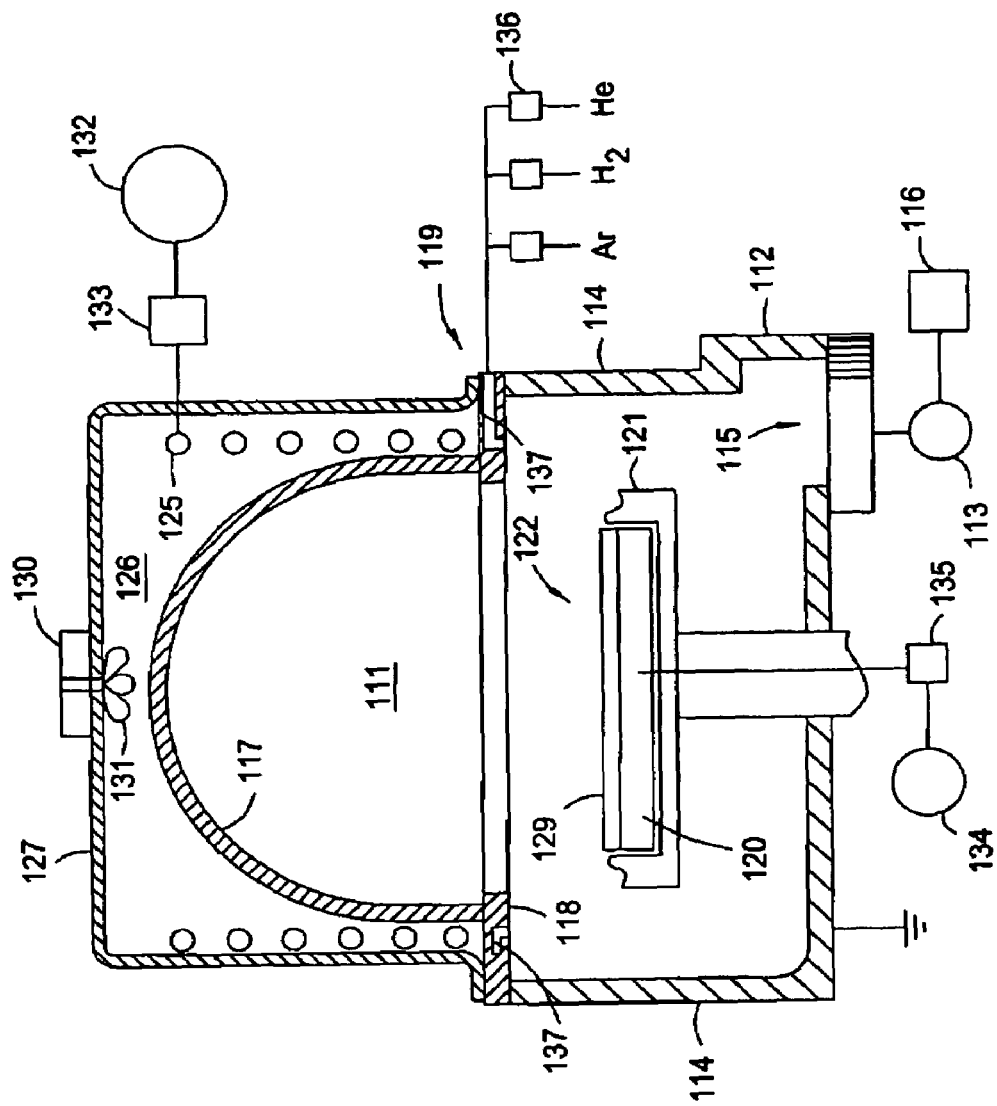
FIG. 3 is a schematic partial sectional view of the reaction chamber suitable for performing a plasma treatment process of the present invention.

Referring now to FIG. 3, a processing chamber for conducting the process of the invention is shown schematically in a section view. The processing chamber can be a Preclean II chamber which is available from Applied Materials, Santa Clara, Calif. A vacuum chamber 111 is formed by a base member 112 having sidewalls 114 and which are preferably made of metallic construction such as stainless steel, aluminum or the like. An opening 115 in the base of the body member 112 is connected to a throttle valve 113 and a turbo pump 116 which is used to control the gas pressure inside the chamber 111. The throttle valve 113 is automated to allow servo control to a specific pressure. A quartz dome 117 forms the top of the chamber 111 and is provided with a flange 118 about its circumference where it mates with the top circumference of the sidewalls 114 of base member 112. A gas distribution system 119 is provided at the juncture of quartz dome 117 and base member 112. The top of the metallic sidewall member 114 has a gas supply trench 137 milled therein and from six to twelve evenly spaced (angularly) disposed channels extending from one or more gas sources intersect the channel to form a plurality of gas injection holes. The gas distribution system 119 supplies Ar, He, and $H_2$ gases which are typically metered by mass flow controllers 136. Hydrogen may also be supplied as a mixture with helium having about 5% hydrogen by volume for safe delivery of the hydrogen. However, a separate hydrogen line is still provided to attain hydrogen concentrations greater than 5% by volume. A pedestal 122, which is arranged to hold a wafer (not shown), has a quartz body 121 surrounding the sides and bottom of a conductive portion 120. An insulating layer 129 may be placed between the conductive portion 120 of the pedestal 122 and the wafer.

RF power from an RF source 134 is applied capacitively to the conductive portion 120 of the pedestal 122. A RF match box 135 adjusts the chamber impedance to optimize power transfer between the power source 134 and the pedestal 122. Typical RF frequencies are from about 2 MHz to about 60 MHz at power levels from about 10W to about 500W.

Additional power is inductively supplied to the plasma by energizing coils 125 wound exterior to the quartz dome 117 and supported by the cover 127. An alternating axial electromagnetic field is produced in the chamber 111 interior to the winding of the coils 125. Generally, an RF frequency between 200 KHz and 16 MHz is employed. A 2 MHz frequency is common. An RF source 132 operating at this frequency is coupled to the coil 125 by matching network 133.

The flow of argon preferably ranges from about 5 to about 50 sccm, and the flow of helium/hydrogen preferably ranges from about 0 sccm to about 2000 sccm for 200 mm substrates. Chamber pressures are between about 1 mTorr and about 200 mTorr. The plasma treatment effectively cleans, treats, and/or modifies the patterned surface in 10 to 150 seconds. After precleaning, a CVD or PVD metal layer is deposited on an optional liner or nucleation layer.

EXAMPLES

The precleaning steps of the present invention have been combined in the preclean chamber shown in FIG. 3 to successfully clean features etched in a dielectric layer having a copper or silicon sublayers prior to filling of the features with Cu, Al, or W plugs. The chamber was stabilized for 5 seconds at a pressure of 5–20 mTorr with a mixture of $H_2$, He, and Ar. The features were then cleaned for 60 seconds by applying from 300W to 450W of 2 MHz RF power to the coil and 10 W to 300W of 13.56 MHz RF power to the pedestal.

Example 1

Examples of the present invention were performed by varying the gas mixture from 100% argon to 10% argon to preclean a patterned substrate surface in a Preclean II chamber on an ENDURA® platform available from Applied Materials, Inc. A silicon wafer having sub 0.30 μm wide contacts, vias, trenches, and other patterns, having an aspect ratio≧4:1 (i.e., a depth of at least 1.20 μm) was introduced into the system. The wafer was then plasma treated with a mixture of argon and He/$H_2$ wherein helium and hydrogen were provided as a mixture having 5% hydrogen by volume.

Figure 4:
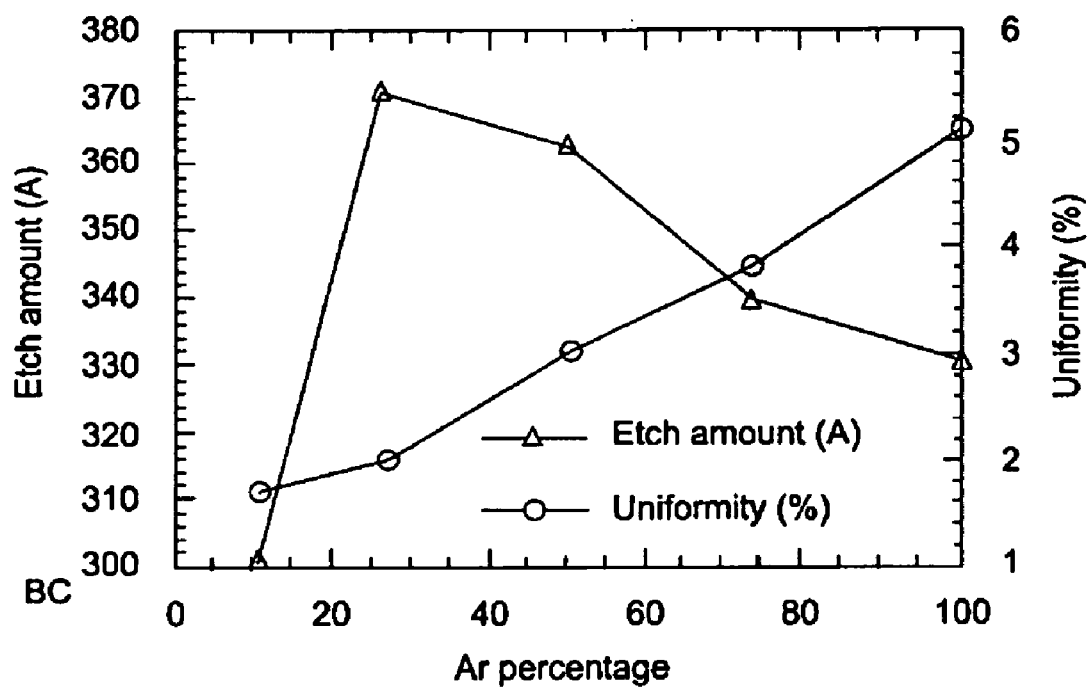
FIG. 4 shows the etch rate and etch uniformity for a preferred plasma comprising argon, helium, and hydrogen.

Referring to FIG. 4, the etch uniformity drops continuously as the helium mixture is added to the process gas. Further, the etch rate improves until the argon percentage is reduced to 25% by volume.

Example 2 (Comparison)

Figure 5:
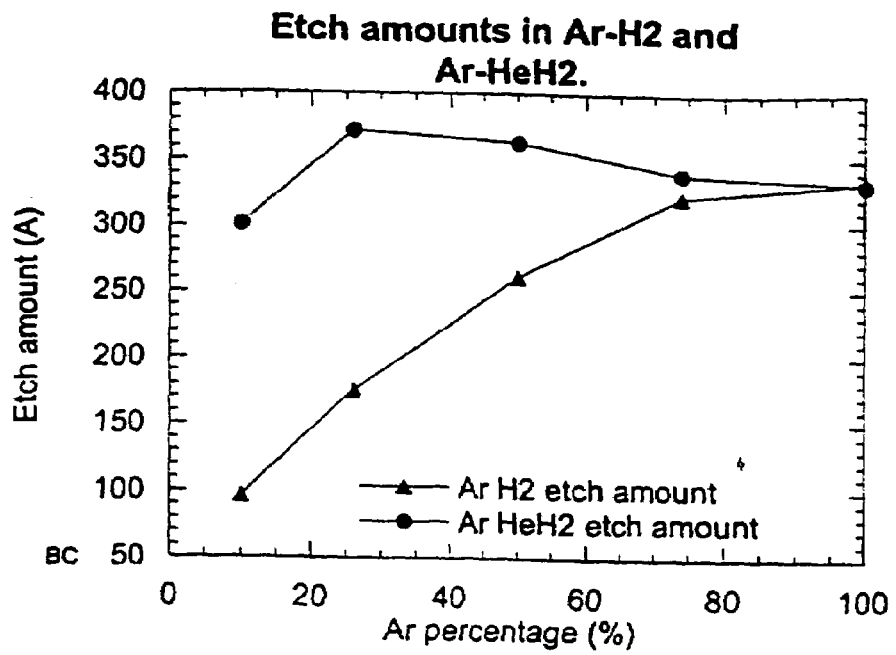
FIG. 5 compares the etch rates of an argon/helium/hydrogen plasma to an argon/hydrogen plasma.
Figure 6:
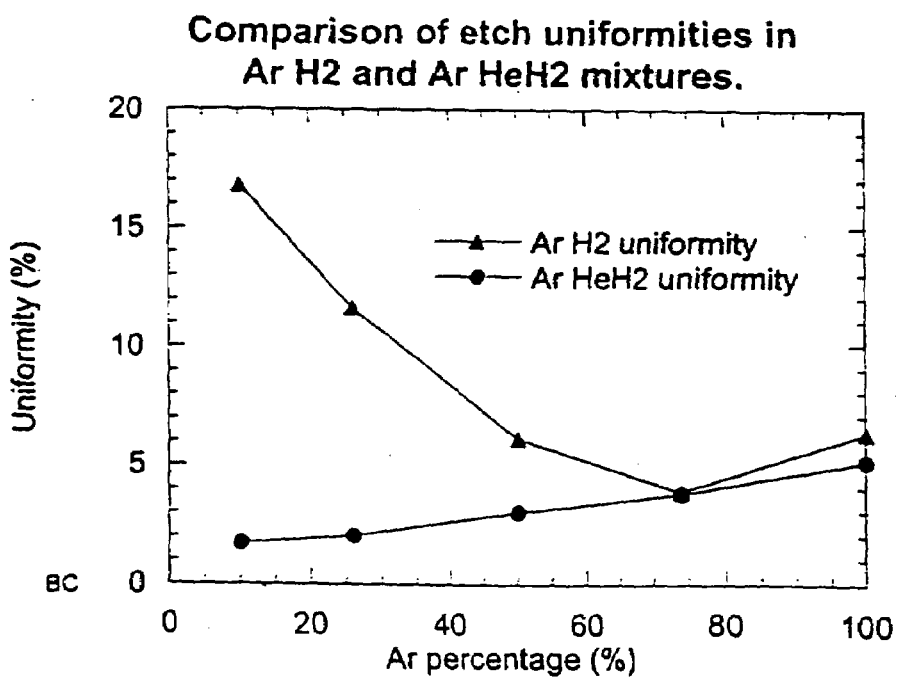
FIG. 6 compares the etch uniformity of an argon/helium/hydrogen plasma to an argon/hydrogen plasma.

For comparison, Example 1 was repeated without the helium. FIG. 5 compares the etch rate for the Ar/He/$H_2$ plasma of Example 1 and the Ar/$H_2$ plasma of Example 2. FIG. 6 compares the etch uniformity for the Ar/He/$H_2$ plasma of Example 1 and the Ar/$H_2$ plasma of Example 2.

While the foregoing is directed to the preferred embodiment of the present invention, other and further embodiments of the invention may be devised without departing from the basic scope thereof. The scope of the invention is determined by the claims that follow.

What is claimed is:

1. A method for processing a substrate in a processing chamber, comprising:
    (a) exposing a patterned substrate surface to a plasma generated from a gas mixture consisting of argon, helium and hydrogen; and
    (b) increasing the helium content of the plasma to increase etching of the patterned substrate surface, wherein the gas mixture comprises less than about 75% by volume of argon, wherein the hydrogen is provided to the processing chamber in a mixture of about 95% by volume of helium and about 5% by volume of hydrogen.

2. The method of claim 1, wherein the substrate surface comprises silicon oxide or silicon nitride.

3. The method of claim 1, wherein the gas mixture is introduced into the processing chamber to establish a pressure from about 1 mTorr to about 200 mTorr.

4. The method of claim 1, wherein the gas mixture comprises between about 25% and about 75% by volume of argon.

5. The method of claim 1, wherein the plasma is generated by delivering a power level of between about 10 watts and about 500 watts to the processing chamber.

6. A method for processing a substrate, comprising:
    (a) exposing a patterned substrate surface to a plasma generated from a gas mixture comprising argon, helium and hydrogen in a processing chamber, wherein the plasma is capacitively and inductively powered; and
    (b) increasing the helium content to increase etching of the patterned substrate surface, wherein the gas mixture comprises less than about 75% by volume of argon, wherein the hydrogen is provided to the processing chamber in a mixture of about 95% by volume of helium and about 5% by volume of hydrogen.

7. The method of claim 6, wherein the substrate surface comprises silicon oxide or silicon nitride.

8. The method of claim 6, wherein the gas mixture is introduced into the processing chamber to establish a pressure from about 1 mTorr to about 200 mTorr.

9. The method of claim 6, wherein the gas mixture comprises between about 25% and about 75% by volume of argon.

10. The method of claim 6, wherein the plasma is generated by delivering a power level of between about 10 watts and about 500 watts to the processing chamber.

11. A method for processing a substrate in a processing chamber, comprising:
   (a) exposing a patterned substrate surface at a pressure between about 5 mTorr and about 20 mTorr to a plasma generated from a gas mixture consisting of argon, helium and hydrogen at a power level between about 300 watts and about 450 watts; and
   (b) increasing the helium content of the plasma to increase etching of the patterned substrate surface, wherein the gas mixture comprises less than about 75% by volume of argon, wherein the gas mixture comprises about 50% by volume of argon, about 48% by volume of helium, and about 2% by volume of hydrogen.

12. The method of claim 11, wherein the patterned substrate comprises a feature having an aspect ratio greater than about 4 to 1.

13. A method for processing a substrate in a processing chamber, comprising:
   (a) exposing a patterned substrate surface at a pressure between about 5 mTorr and about 20 mTorr to a plasma generated from a gas mixture consisting of argon, helium and hydrogen at a power level between about 300 watts and about 450 watts; and
   (b) increasing the helium content of the plasma to increase etching of the patterned substrate surface, wherein the gas mixture comprises less than about 75% by volume of argon, wherein the gas mixture comprises about 25% by volume of argon, about 71% by volume of helium, and about 4% by volume of hydrogen.

14. The method of claim 13, wherein the patterned substrate comprises a feature having an aspect ratio greater than about 4 to 1.

15. A method for processing a substrate in a processing chamber, comprising:
   exposing a patterned substrate surface at a pressure between about 5 mTorr and about 20 mTorr to a plasma generated at a power level between about300 watts and about 450 watts from a gas mixture consisting of less than 75% by volume of argon and a mixture of about 95% by volume of helium and about 5% by volume of hydrogen; and
   increasing the helium content of the plasma while decreasing the argon content of the plasma,
   wherein the patterned substrate comprises a feature having an aspect ratio greater than about 4 to 1.

16. The method of claim 15, wherein the gas mixture comprises about 50% by volume of argon, about 48% by volume of helium, and about 2% by volume of hydrogen.

17. A method for processing a substrate, comprising:
   depositing a conductive or semiconductive sublayer;
   depositing a dielectric layer on the sublayer;
   etching the dielectric layer to expose at least a portion of the sublayer and to form a patterned substrate surface;
   exposing the patterned substrate surface to a plasma generated from a gas mixture consisting of argon, helium and hydrogen, wherein the gas mixture comprises about 25% by volume of argon, about 71% by volume of helium, and about 4% by volume of hydrogen;
   increasing the helium content of the plasma to increase etching of the patterned substrate surface, wherein the gas mixture comprises less than about 75% by volume of argon; and
   depositing a metal interconnect layer on the dielectric layer.

18. The method of claim 17, wherein the conductive or semiconductive sublayer comprises a material selected from the group consisting of germanium, silicon, aluminum, copper, and titanium nitride.

19. The method of claim 17, wherein the dielectric layer comprises silicon oxide or silicon nitride.

20. The method of claim 17, wherein the argon content of the plasma decreases from about 75% by volume to about 25% by volume.

* * * * *